(12) United States Patent
Choi et al.

(10) Patent No.: US 9,799,713 B2
(45) Date of Patent: Oct. 24, 2017

(54) ORGANIC LIGHT-EMITTING DIODE DISPLAY WITH BARRIER LAYER

(71) Applicant: Apple Inc., Cupertino, CA (US)

(72) Inventors: Jae Won Choi, Cupertino, CA (US); Shih Chang Chang, Cupertino, CA (US); Young Bae Park, San Jose, CA (US); ZhiFeng Zhan, Cupertino, CA (US); Chieh-Wei Chen, Cupertino, CA (US); Tsung-Ting Tsai, Taipei (TW); Chin-Wei Lin, Cupertino, CA (US); Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/168,601

(22) Filed: May 31, 2016

(65) Prior Publication Data

US 2017/0025489 A1    Jan. 26, 2017

Related U.S. Application Data

(60) Provisional application No. 62/196,213, filed on Jul. 23, 2015.

(51) Int. Cl.
*H01L 27/32* (2006.01)
*H01L 51/52* (2006.01)
*H01L 27/12* (2006.01)

(52) U.S. Cl.
CPC ...... *H01L 27/3258* (2013.01); *H01L 27/3246* (2013.01); *H01L 51/5253* (2013.01); *H01L 27/1248* (2013.01)

(58) Field of Classification Search
CPC ....... H01L 2924/12044; H01L 51/0097; H01L 27/1214; H01L 27/1251; H01L 27/286; H01L 27/3274; H01L 29/408
See application file for complete search history.

(56) References Cited

U.S. PATENT DOCUMENTS

| 6,069,443 | A  | 5/2000  | Jones et al.   |
|-----------|----|---------|----------------|
| 6,506,616 | B1 | 1/2003  | Kim et al.     |
| 7,025,647 | B2 | 4/2006  | Miyazawa       |
| 8,598,780 | B2 | 12/2013 | Kim et al.     |
| 8,785,949 | B2 | 7/2014  | Yamazaki et al.|
| 9,276,230 | B2 | 3/2016  | Kim            |

(Continued)

*Primary Examiner* — Roy Potter
(74) *Attorney, Agent, or Firm* — Treyz Law Group, P.C.; Kendall W. Abbasi

(57) ABSTRACT

A display may have an array of pixels formed from organic light-emitting diodes and thin-film transistor circuitry. A planarization layer may be interposed between the thin-film transistor circuitry and the organic light-emitting diodes. To protect the organic light-emitting diodes from photoactive compounds that may be outgassed from the planarization layer, an inorganic barrier layer may be interposed between the planarization layer and the organic light-emitting diodes. The inorganic barrier layer may be formed on top of and/or below a pixel definition layer that defines light-emitting zones for the organic light-emitting diodes. In another suitable arrangement, the inorganic barrier layer may itself define light-emitting zones and may be used in place of a polymer-based pixel definition layer. The inorganic barrier layer may include trenches in which the emissive material of the light-emitting diodes is formed.

19 Claims, 17 Drawing Sheets

(56) References Cited

U.S. PATENT DOCUMENTS

| | | |
|---|---|---|
| 9,312,319 B2 | 4/2016 | Lee et al. |
| 2006/0091397 A1* | 5/2006 | Akimoto ............ H01L 27/3244 257/72 |
| 2007/0132381 A1* | 6/2007 | Hayashi ............. H01L 51/5253 313/512 |
| 2014/0021499 A1 | 1/2014 | Jang |
| 2014/0167006 A1* | 6/2014 | Kim ................... H01L 27/3244 257/40 |
| 2014/0361263 A1 | 12/2014 | Kim |

* cited by examiner

ORGANIC LIGHT-EMITTING DIODE DISPLAY WITH BARRIER LAYER

This application claims the benefit of provisional patent application No. 62/196,213, filed Jul. 23, 2015, which is hereby incorporated by reference herein in its entirety.

BACKGROUND

This relates generally to electronic devices with displays and, more particularly, to electronic devices with organic light-emitting diode displays.

Electronic devices often include displays. Displays such as organic light-emitting diode displays include arrays of pixels that emit light to display images for a user. The pixels of a display may include emissive material of different colors to provide the display with the ability to display color images. The organic light-emitting diodes are controlled by thin-film transistor circuitry.

In a typical arrangement, a planarization layer is formed over the thin-film transistor circuitry before forming the organic light-emitting diodes. The planarization layer is formed using photolithographic techniques and therefore contains photoactive compounds that react to light. When an organic light-emitting diode display is exposed to large amounts of ultraviolet light (e.g., in an outdoor environment), these photoactive compounds may overtime become activated and outgassing may occur. Outgassed photoactive compounds from a planarization layer may attack the emissive material in a diode which may in turn lead to reduced pixel aspect ratio, a shifted current-voltage curve, and reduced pixel efficiency.

It would therefore be desirable to be able to provide improved displays such as improved organic light-emitting diode displays.

SUMMARY

A display may have an array of pixels on a substrate. The display may be an organic light-emitting diode display and the pixels may include organic light-emitting diodes of different colors. The display may include thin-film transistor circuitry that controls the organic light-emitting diode pixels. Each organic light-emitting diode may have an anode, a cathode, and an emissive layer between the anode and cathode.

A planarization layer may be interposed between the thin-film transistor circuitry and the organic light-emitting diodes. To protect the organic light-emitting diodes from photoactive compounds that may be outgassed from the planarization layer, an inorganic barrier layer may be interposed between the planarization layer and the organic light-emitting diodes. The inorganic barrier layer may be formed on top of and/or below a pixel definition layer that defines light-emitting zones for the organic light-emitting diodes.

In another suitable arrangement, the inorganic barrier layer may be used in place of a polymer-based pixel definition layer or may be used in conjunction with a polymer-based layer to form a pixel definition layer. The inorganic barrier layer may include trenches that define light-emitting zones for the organic light-emitting diode pixels. The organic light-emitting diodes may include emissive material in the trenches of the inorganic barrier layer.

DETAILED DESCRIPTION

Figure 1:
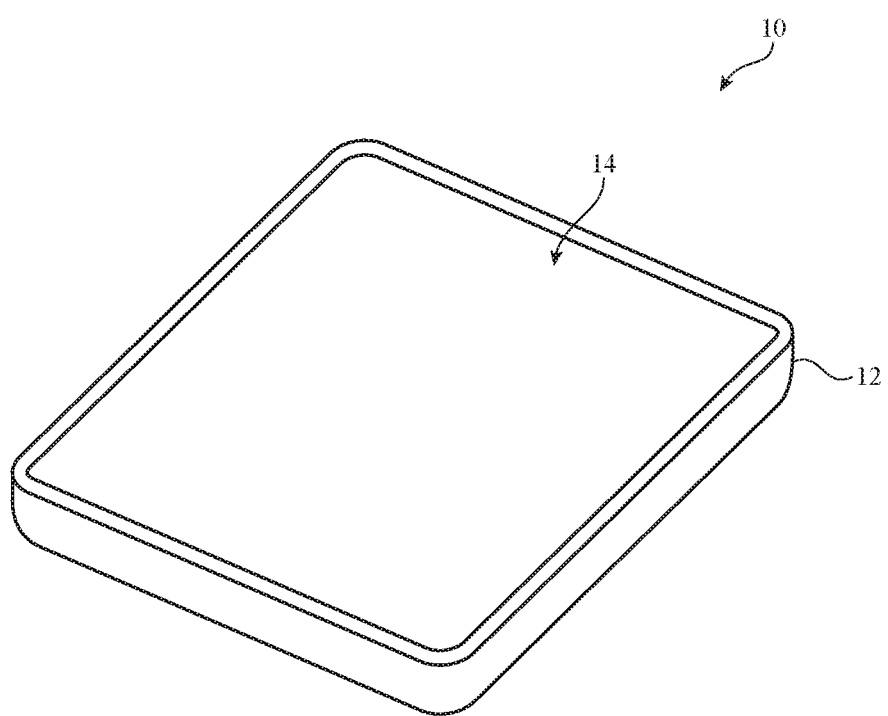
FIG. 1 is a perspective view of an illustrative electronic device having a display in accordance with an embodiment.

An illustrative electronic device of the type that may be provided with a display is shown in FIG. 1. Electronic device 10 may be a computing device such as a laptop computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a computer monitor or other display containing an embedded computer or other electronic equipment, a computer display or other monitor that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include an array of pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. Configurations in which display 14 is an organic light-emitting diode display are sometimes described herein as an example. The use of organic light-emitting diode pixels to form display 14 is merely illustrative. Display 14 may, in general, be formed using any suitable type of pixels.

Display 14 may be protected using a display cover layer such as a layer of transparent glass or clear plastic. Openings may be formed in the display cover layer. For example, an opening may be formed in the display cover layer to accommodate a button, a speaker port, or other component. Openings may be formed in housing 12 to form communications ports (e.g., an audio jack port, a digital data port, etc.), to form openings for buttons, etc.

Figure 2:
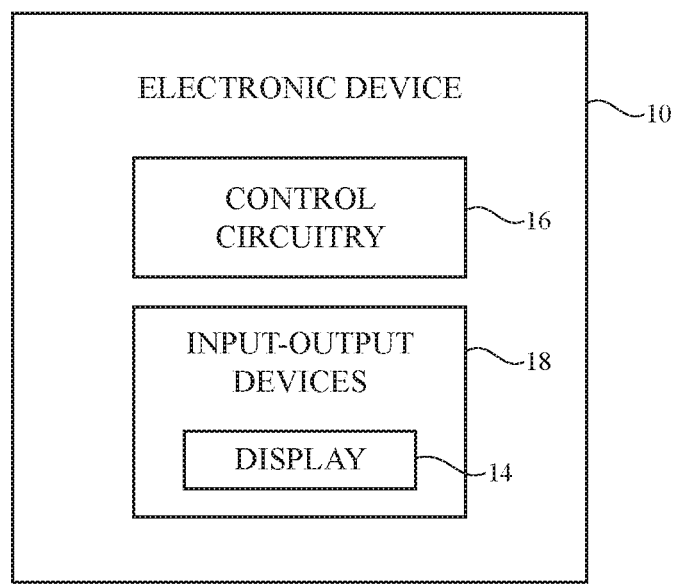
FIG. 2 is a schematic diagram of an illustrative electronic device having a display in accordance with an embodiment.

FIG. 2 is a schematic diagram of device 10. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include one or more displays such as display 14.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 3:
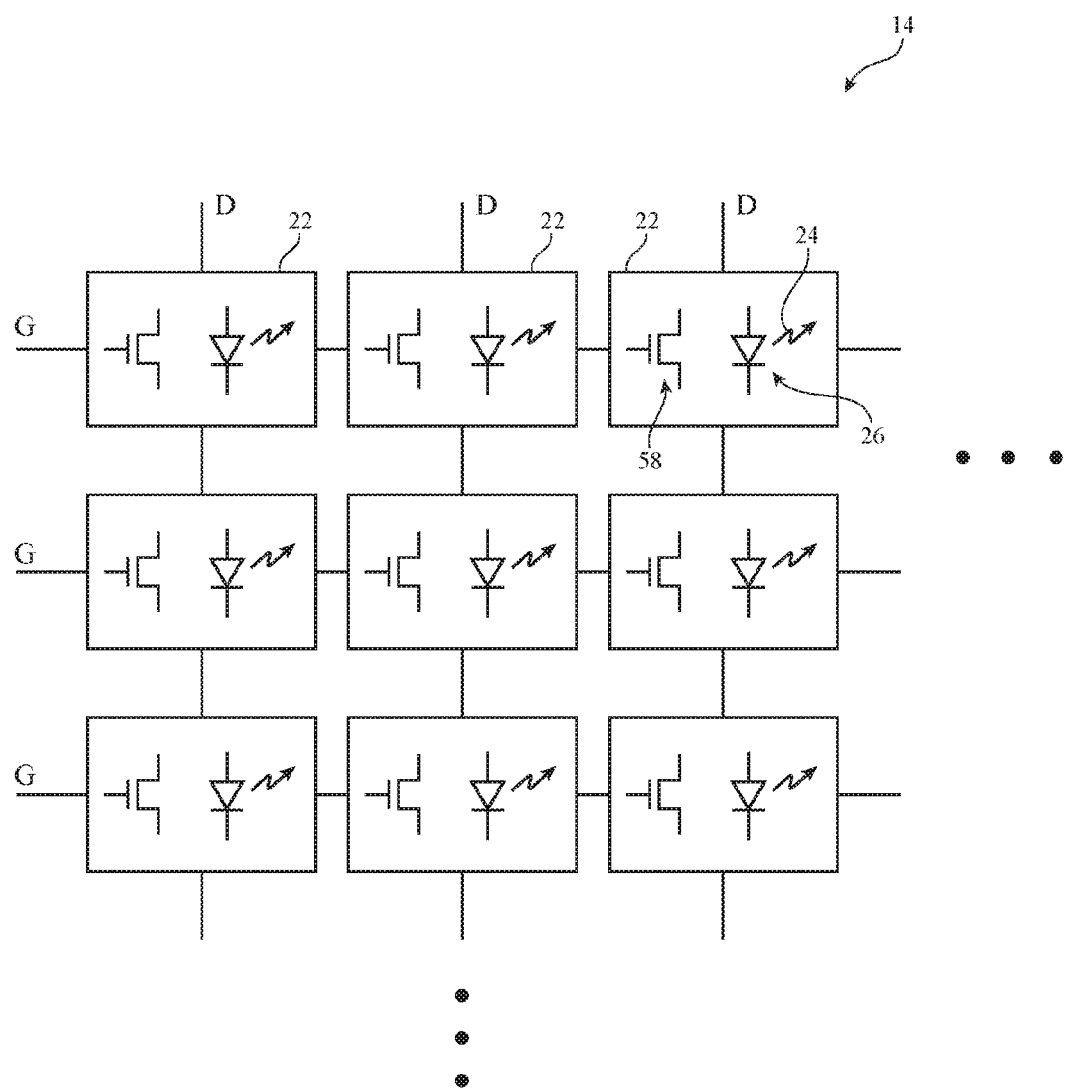
FIG. 3 is a top view of an illustrative display in an electronic device in accordance with an embodiment.

A top view of a portion of display 14 is shown in FIG. 3. As shown in FIG. 3, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from transistor circuitry such as thin-film transistors 58 and thin-film capacitors). Transistors 58 may be polysilicon thin-film transistors, semiconducting-oxide thin-film transistors such as indium gallium zinc oxide transistors, or transistors formed from other semiconductors.

Figure 4:
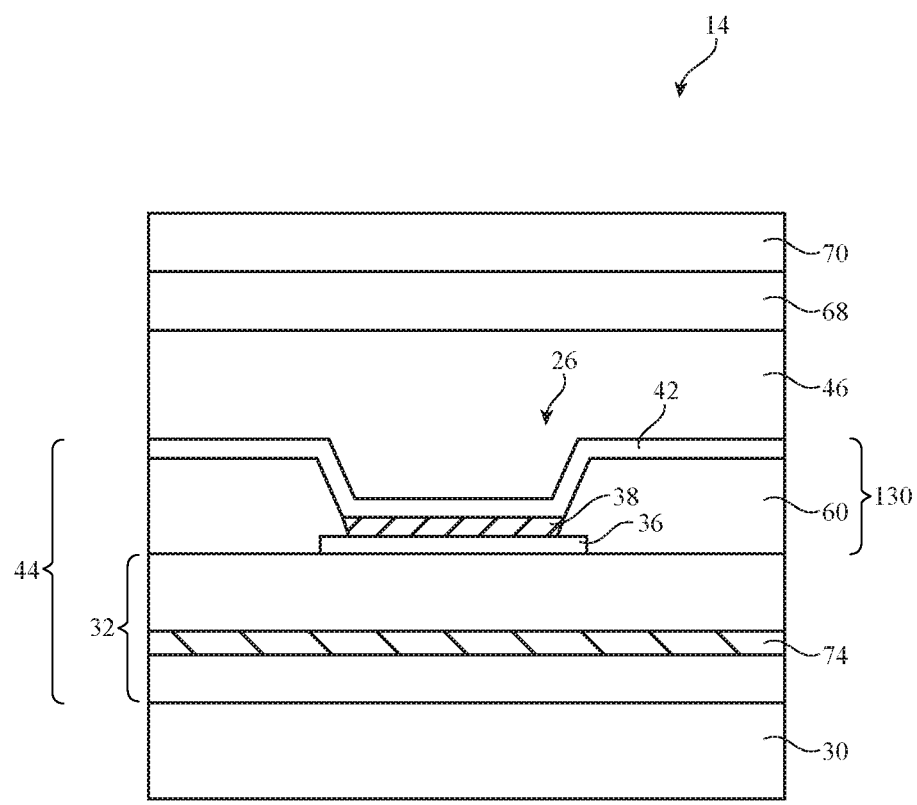
FIG. 4 is a cross-sectional side view of a portion of an illustrative organic light-emitting diode display in accordance with an embodiment.

A cross-sectional side view of a portion of an illustrative organic light-emitting diode display in the vicinity of one of light-emitting diodes 26 is shown in FIG. 4. As shown in FIG. 4, display 14 may include a substrate layer such as substrate layer 30. Substrate 30 may be formed from a polymer or other suitable materials.

Thin-film transistor circuitry 44 may be formed on substrate 30. Thin film transistor circuitry 44 may include layers 32. Layers 32 may include inorganic layers such as inorganic buffer layers, barrier layers (e.g., barrier layers to block moisture and impurities), gate insulator, passivation, interlayer dielectric, and other inorganic dielectric layers. Layers 32 may also include organic dielectric layers such as a polymer planarization layer. Metal layers and semiconductor layers may also be included within layers 32. For example, semiconductors such as silicon, semiconducting-oxide semiconductors, or other semiconductor materials may be used in forming semiconductor channel regions for thin-film transistors 58. Metal in layers 32 such as metal traces 74 may be used in forming transistor gate terminals, transistor source-drain terminals, capacitor electrodes, and metal interconnects.

As shown in FIG. 4, thin-film transistor circuitry 44 may include diode anode structures such as anode 36. Anode 36 may be formed from a layer of conductive material such as metal on the surface of layers 32 (e.g., on the surface of a planarization layer that covers underlying thin-film transistor structures). Light-emitting diode 26 may be formed within an opening in pixel definition layer 60. Pixel definition layer 60 may be formed from a patterned photoimageable polymer such as polyimide and/or may be formed from one or more inorganic layers such as silicon nitride, silicon dioxide, or other suitable materials.

In each light-emitting diode, layers of organic material 38 may be interposed between a respective anode 36 and cathode 42. Anodes 36 may be patterned from a layer of metal (e.g., silver) and/or one or more other conductive layers such as a layer of indium tin oxide or other transparent conductive material. Cathode 42 may be formed from a common conductive layer that is deposited on top of pixel definition layer 60. Cathode 42 may be formed from a thin metal layer (e.g., a layer of metal such as a magnesium silver layer) and/or indium tin oxide or other transparent conductive material. Cathode 42 is preferably sufficiently transparent to allow light 24 to exit light emitting diode 26.

If desired, the anode of diode 26 may be formed from a blanket conductive layer and the cathode of diode 26 may be formed from a patterned conductive layer. The illustrative configuration of display 14 in which a transparent blanket cathode layer 42 covers diodes that have individually patterned anodes 36 allows light 24 to be emitted from the top of display 14 (i.e., display 14 in the example of FIG. 4 is a "top emission" organic light-emitting diode display). Display 14 may be implemented using a bottom emission configuration if desired. Layers such as layers 36, 38, and 42 are used in forming organic light-emitting diodes such as diode 26 of FIG. 4, so this portion of display 14 is sometimes referred to as an organic light-emitting diode layer (see, e.g., layer 130 of FIG. 4).

Metal interconnect structures may be used to interconnect transistors and other components in circuitry 44. Metal interconnect lines may also be used to route signals to capacitors, to data lines D and gate lines G, to contact pads (e.g., contact pads coupled to gate driver circuitry), and to other circuitry in display 14. As shown in FIG. 4, layers 32 may include one or more layers of patterned metal for forming interconnects such as metal traces 74 (e.g., traces 74 may be used in forming data lines D, gate lines G, power supply lines, clock signal lines, and other signal lines).

If desired, display 14 may have a protective outer display layer such as cover layer 70. The outer display layer may be formed from a material such as sapphire, glass, plastic, clear ceramic, or other transparent material. Protective layer 46 may cover cathode 42. Layer 46, which may sometimes be referred to as an encapsulation layer may include moisture barrier structures, encapsulant materials such as polymers, adhesive, and/or other materials to help protect thin-film transistor circuitry.

Functional layers 68 may be interposed between layer 46 and cover layer 70. Functional layers 68 may include a touch sensor layer, a circular polarizer layer, and other layers. A circular polarizer layer may help reduce light reflections from reflective structures such as anodes 36. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 70 and functional layers 68 to underlying display layers such as layer 46, thin-film transistor circuitry 44, and substrate 30.

Organic layer 38 may include an organic emissive layer (e.g., a red emissive layer in red diodes 26 that emits red light, a green emissive layer in green diodes 26 that emits green light, and a blue emissive layer in blue diodes 26 that emits blue light, etc.). The emissive material may be a material such as a phosphorescent material or fluorescent material that emits light during diode operation. The emissive material in layer 38 may be sandwiched between additional diode layers such as hole injection layers, hole transport layers, electron injection layers, and electron transport layers.

Figure 5:
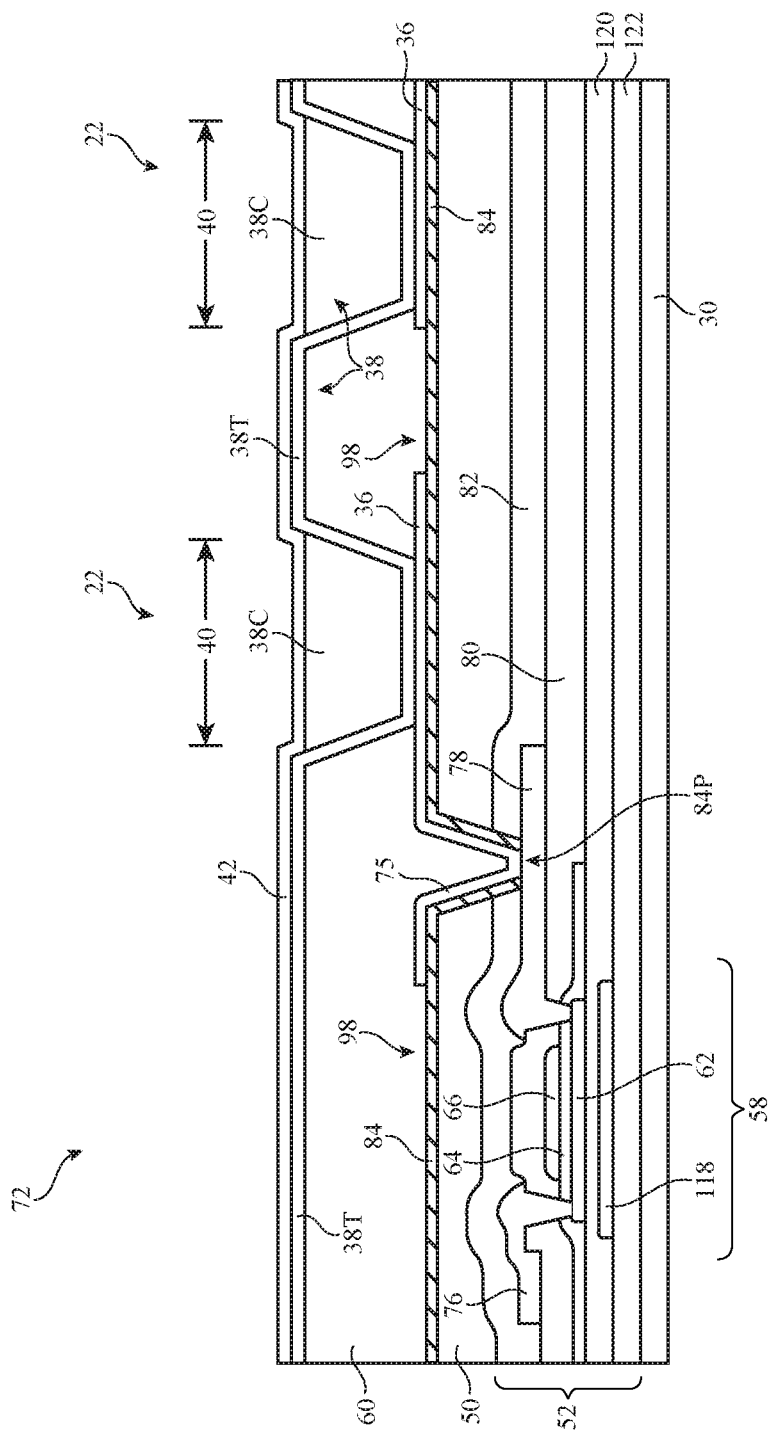
FIG. 5 is a cross-sectional side view of illustrative organic light-emitting diode display structures having a barrier layer interposed between a planarization layer and an anode in accordance with an embodiment.

Organic light-emitting diode pixels such as pixel 22 of FIG. 3 or any other suitable pixel circuits for display 14 may use thin-film transistor structures of the type shown in FIG. 5. As shown in FIG. 5, organic light-emitting diode display structures 72 may include pixel structures such as light-emitting diode cathode terminal 42 and light-emitting diode anode terminal 36. Organic layer 38 may be interposed between cathode 42 and anode 36, thereby forming light-emitting diode 26 of FIG. 4. Organic layer 38 may include organic emissive layer 38C (e.g., a red emissive layer in red diodes 26 that emits red light, a green emissive layer in green diodes 26 that emits green light, and a blue emissive layer in blue diodes 26 that emits blue light, etc.) and common layer 38T (e.g., layers that are common to multiple diodes 26 such as a hole injection layer, a hole transport layer, an electron injection layer, and an electron transport layer). Emissive portions 38C may each be associated with a respective pixel whereas common layer 38T may be common to multiple pixels 22 (e.g., common layer 38T may be a blanket layer that forms part of and extends between pixels 22).

Dielectric layer 60 may serve to define the layout of the pixel (e.g., alignment of the emissive material 38C with respect to anode 36) and may sometimes be referred to as a pixel definition layer. Planarization layer 50 (e.g., a polymer layer) may be formed on top of thin-film transistor structures 52. Thin-film transistor structures 52 may be formed on substrate 30. Substrate 30 may be rigid or flexible and may be formed from glass, ceramic, crystalline material such as sapphire, polymer (e.g., a flexible layer of polyimide or a flexible sheet of other polymer material), etc.

Thin-film transistor structures 52 may include silicon transistors such as silicon transistor 58. Transistor 58 may be an LTPS transistor formed using a "top gate" design and may be used to form any of the transistors in pixel 22 (e.g., transistor 58 may serve as a drive transistor or other suitable transistor in pixel 22). Transistor 58 may have a polysilicon channel 62 that is covered by gate insulator layer 64 (e.g., a layer of silicon oxide or other inorganic layer). Gate 66 may be formed from patterned metal (e.g., molybdenum, as an example). Gate 66 may be covered by a layer of interlayer dielectric 80 (e.g., a silicon nitride layer, a silicon oxide layer, and/or other inorganic layers or organic material). Source-drain contacts 76 and 78 may contact opposing sides of polysilicon layer 62 to form the silicon thin-film transistor 58.

Gate 66 may be formed from a metal layer, source-drain terminals 76 and 78 may be formed from a metal layer, and an additional metal layer may be used to form metal via 75 to couple source-drain electrode 78 to anode 36. A passivation layer such as passivation layer 82 may be formed over source-drain terminals 78 and 76 and over interlayer dielectric 80. Passivation layer 82 may be formed from one or more layers of dielectric such as silicon oxide and silicon nitride. Other inorganic layers and/or organic layers may be used in forming layer 82, if desired (e.g., oxide layers, nitride layers, polymer layers, etc.).

Buffer layer 122 on substrate 30 may be formed from a layer of polyimide or other dielectric. Back-side metal layer 118 may be formed under transistor 58 to shield transistor 58 from charge in buffer layer 122. Buffer layer 120 may be formed over shield layer 118 and may be formed from a dielectric (e.g., an organic layer such as a polymer layer or other insulating layer).

To achieve consistent optical performance, a planarization layer such as planarization layer 50 may be formed over thin-film transistors 58 to ensure that pixel electrodes such as anode 36 are flat. An additional organic layer such as polymer layer 60 (sometimes referred to as pixel definition layer 60) may be used to define light-emitting zone 40 of each pixel 22.

Planarization layer 50 and pixel definition layer 60 may be formed using photolithographic techniques and may therefore contain photoactive compounds that react to light. In some situations, these photoactive compounds may over-time become activated and outgassing may occur (e.g., when an organic light-emitting diode display is outdoors and is exposed to large amounts of ultraviolet light). If care is not taken, outgassing can degrade organic light-emitting diode performance. For example, outgassed photoactive compounds from a planarization layer and/or a pixel definition layer may attack the emissive material in a diode which may in turn lead to reduced pixel aspect ratio, a shifted current-voltage curve, and reduced pixel efficiency.

To prevent outgassed molecules or compounds from reaching emissive material 38C, a blocking layer such as barrier layer 84 may be incorporated into display structures 72 between organic layer 38 and polymer layers that contain photoactive compounds (e.g., planarization layer 50 and/or pixel definition layer 60). Barrier layer 84 may be formed from one or more layers of inorganic material such as silicon oxide, silicon nitride, aluminum oxide, hafnium oxide, or other suitable material that can block outgassed compounds or molecules from reaching organic layers 38. Barrier layer 84 may be a single layer or may be formed from multiple layers. Barrier layer 84 may have a thickness between 30 nm and 50 nm, between 40 nm and 60 nm, greater than 60 nm, less than 60 nm, etc.

In the example of FIG. 5, barrier layer 84 (sometimes referred to as inorganic layer 84, passivation layer 84, or blocking layer 84) is interposed between planarization layer 50 and pixel definition layer 60. Barrier layer 84 may be formed under anode 36 such that anode 36 is interposed between barrier layer 84 and pixel definition layer 60. Since anode 36 is formed over barrier layer 84, barrier layer 84 may include openings 84P that align with via 75 so that via 75 can electrically connect anode 36 to source-drain terminal 78.

As shown in FIG. 5, barrier layer 84 cover gaps 98 between adjacent anodes 36. The presence of barrier layer 84 over openings 98 helps prevent photo-reactive molecules that may be outgassed from planarization layer 50 from passing through openings 98 to reach organic layers 38.

Figure 6:
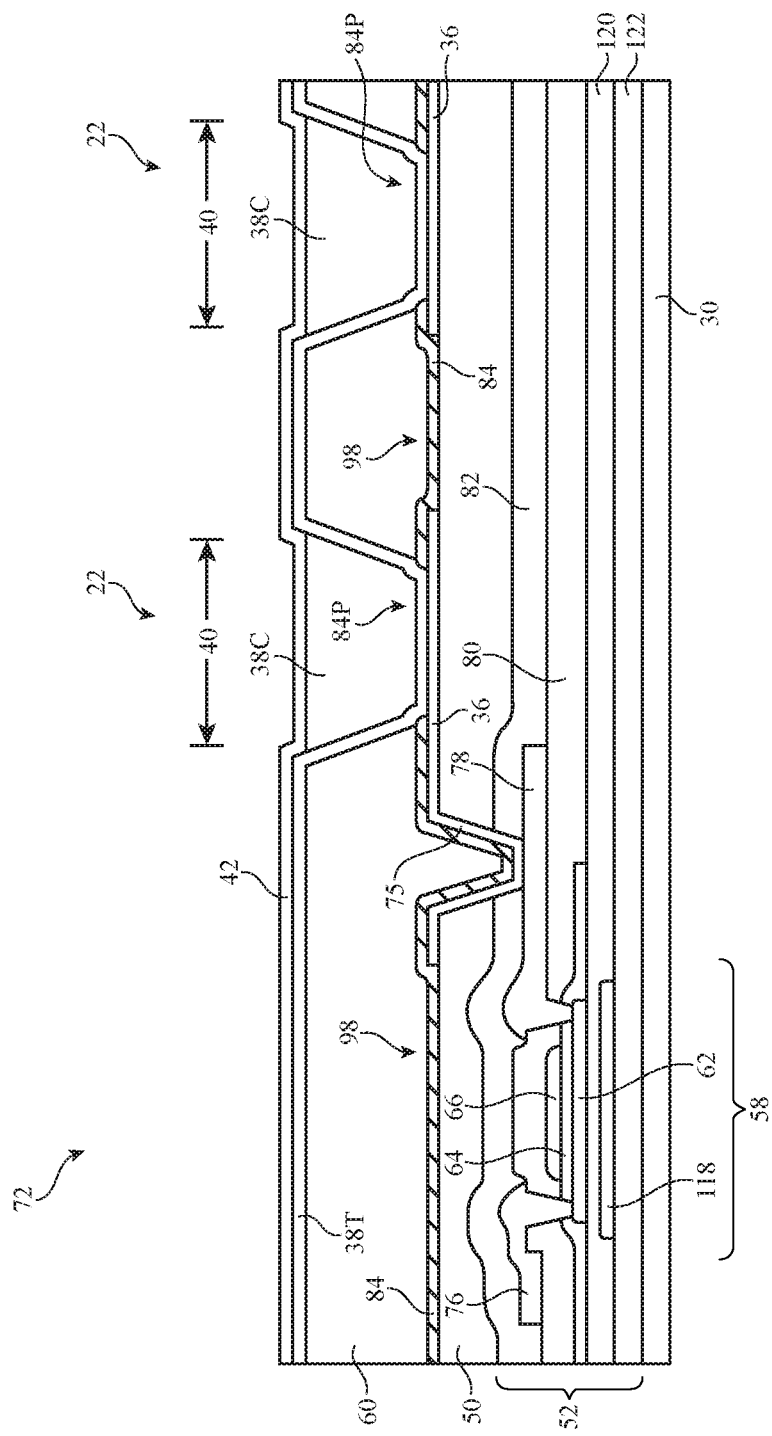
FIG. 6 is a cross-sectional side view of illustrative organic light-emitting diode display structures having a barrier layer interposed between a pixel definition layer and an anode in accordance with an embodiment.

FIG. 6 is another illustrative example in which barrier layer 84 is interposed between planarization layer 50 and pixel definition layer 60. In the example of FIG. 6, however, barrier layer 84 is formed over anodes 36 such that barrier layer 84 is interposed between pixel definition layer 60 and anodes 36. Since anodes 36 and vias 75 are formed under barrier layer 84, openings need not be formed in barrier layer 84 to accommodate vias 75. Barrier layer 84 may, however, include openings 84P to allow anodes 36 to contact organic layers 38 (e.g., to contact portions of common layer 38T overlapping emissive material layer 38C in light-emitting zones 40).

As with the example of FIG. 5, barrier layer 84 covers gaps 98 between adjacent anodes 36. The presence of barrier layer 84 over openings 98 helps prevent compounds or molecules that may be outgassed from planarization layer 50 from passing through openings 98 to reach organic layers 38.

Figure 7:
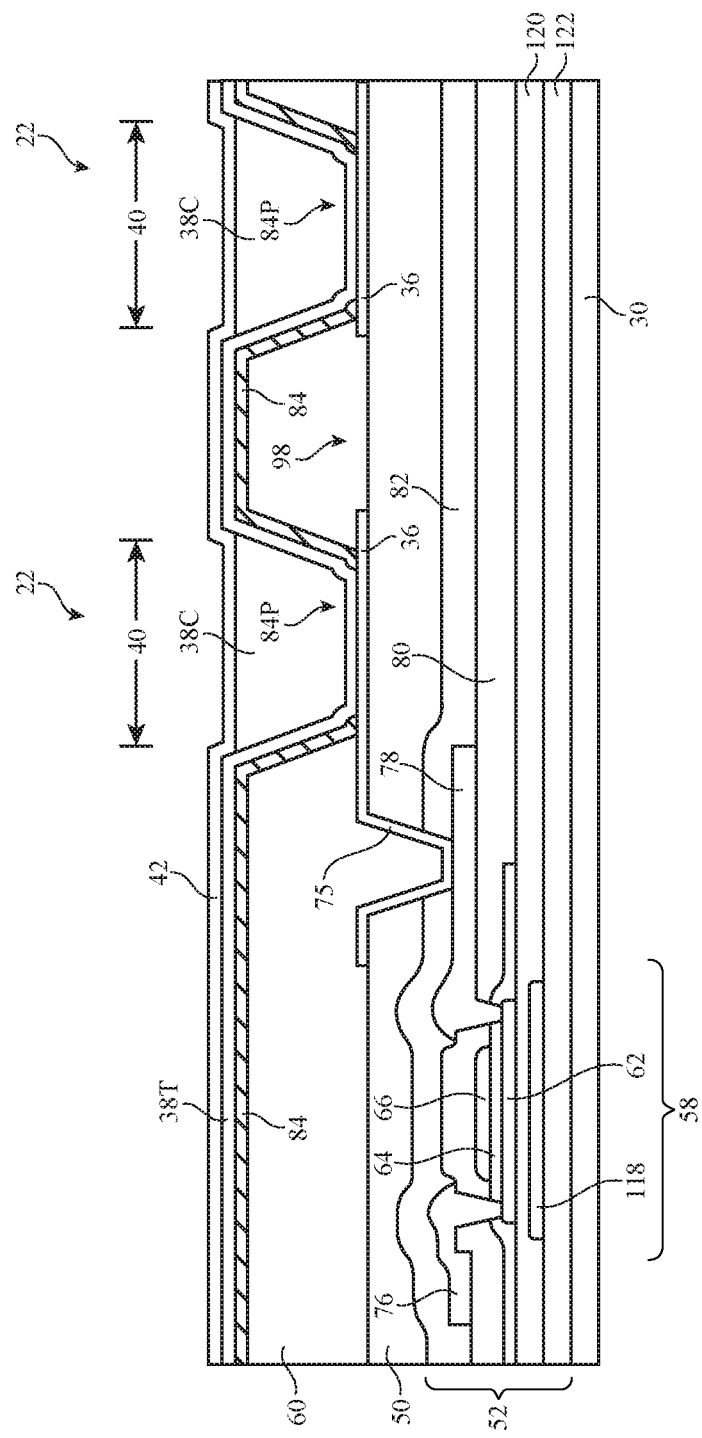
FIG. 7 is a cross-sectional side view of illustrative organic light-emitting diode display structures having a barrier layer interposed between a common organic layer and a pixel definition layer in accordance with an embodiment.

In the example of FIG. 7, barrier layer 84 is formed over both planarization layer 50 and pixel definition layer 60 such that pixel definition layer 60 is interposed between barrier layer 84 and planarization layer 50. Barrier layer 84 may be sandwiched between pixel definition layer 60 and common layer 38T. Since barrier layer 84 is formed over pixel definition layer 60, openings 84P may be formed in barrier layer 84 over portions of anodes 36 that overlap emissive material 38C. This allows anodes 36 to contact common layer 38 through openings 84P in light-emitting zones 40.

The presence of barrier layer 84 over planarization layer 50 and pixel definition layer 60 helps protect common layer 38T and emissive layer 38C from photoactive compounds that may be outgassed from polymer layers 50 and 60.

The examples of FIGS. 5, 6, and 7 in which barrier layer 84 is formed from an inorganic layer between or on top of planarization layer 50 and pixel definition layer 60 is merely illustrative. If desired, one or more of the existing layers in an organic light-emitting diode structures 72 may incorporate inorganic material to act as a blocking layer for protecting organic layers 38. This type of approach is illustrated in FIG. 8.

Figure 8:
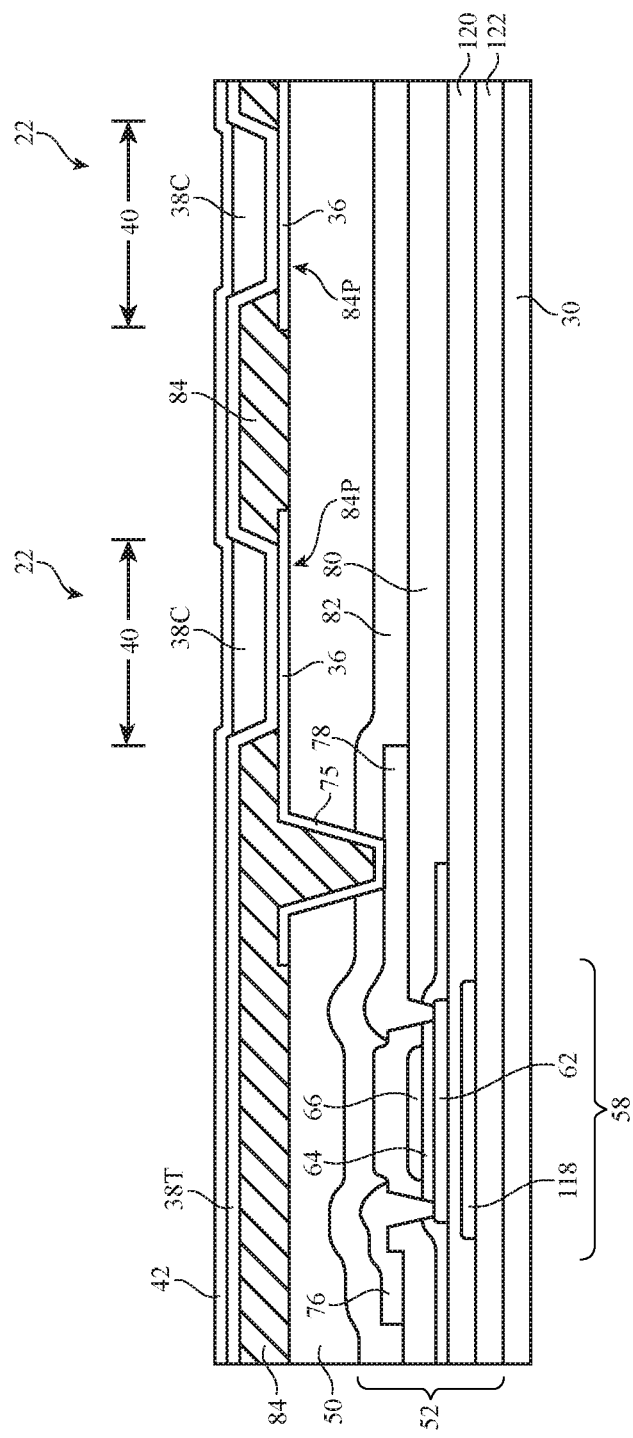
FIG. 8 is a cross-sectional side view of illustrative organic light-emitting diode display structures having a barrier layer that forms a pixel definition layer in accordance with an embodiment.

In the example of FIG. 8, barrier layer 84 serves both as a blocking layer that blocks any outgassed molecules from planarization layer 50 and as a pixel definition layer that defines the layout of pixels 22 (barrier layer 84 may define walls and openings for aligning emissive material 38C with respect to anode 36 to thereby form light-emitting zones 40). If desired, inorganic barrier layer 84 may be used in place of an organic pixel definition layer (e.g., a pixel definition layer formed from photoimageable polymer).

As shown in FIG. 8, barrier layer 84 may include openings 84P that align with emissive material 38C and anodes 36. Openings 84P (sometimes referred to as trenches, holes, or cavities) provide cavities in which emissive material 38C may be deposited while also allowing anode 36 to contact common layer 38T in regions 40.

The example of FIG. 8 in which inorganic barrier layer 84 replaces an organic pixel definition layer is merely illustrative. If desired, both inorganic and organic layers may be used to form a pixel definition layer that defines light-emitting zones 40 and a blocking layer that blocks light-activated compounds. Examples of this type of arrangement are illustrated in FIGS. 9-14.

Figure 9:
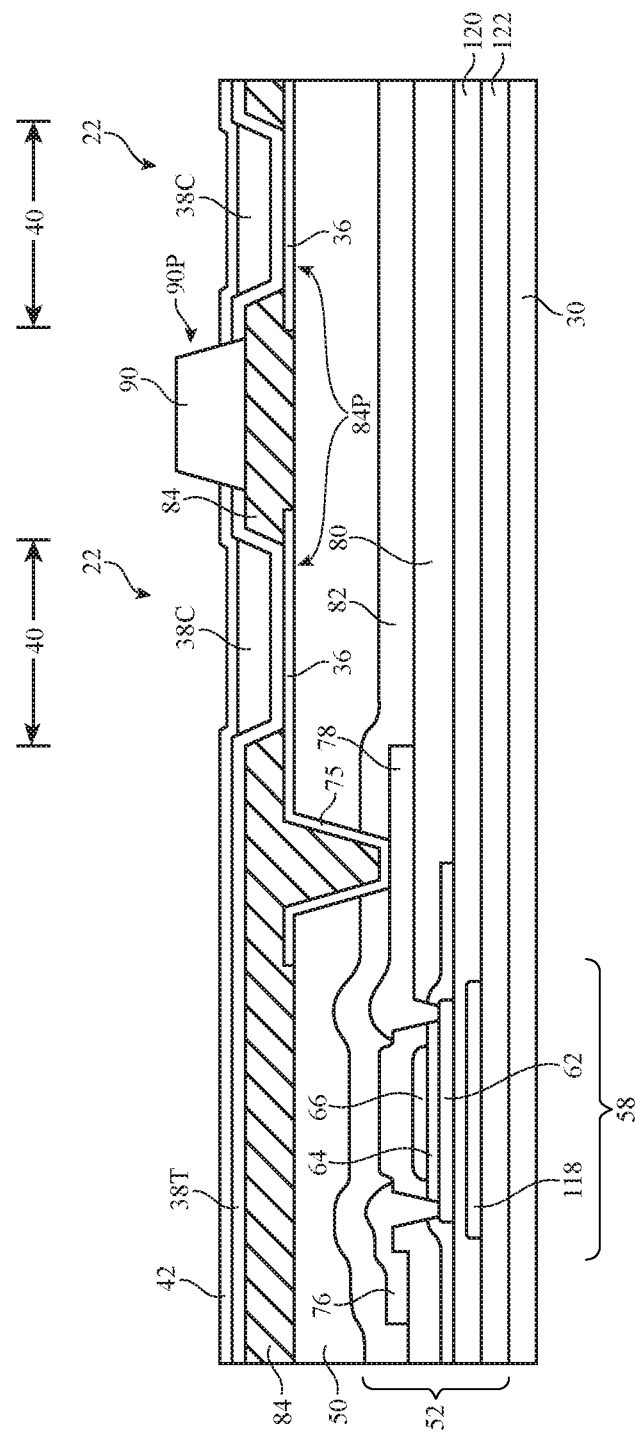
FIG. 9 is a cross-sectional side view of illustrative organic light-emitting diode display structures having a barrier layer that forms a pixel definition layer and an organic layer that forms a spacer between adjacent light-emitting zones in accordance with an embodiment.

As shown in FIG. 9, inorganic barrier layer 84 and organic layer 90 together define a pixel definition layer that defines light-emitting zones for pixels 22. Barrier layer 84 serves to protect organic layers 38 from outgassed molecules while also providing openings 84P in which emissive material 38C is formed. Organic layer 90 forms a protrusion 90P (sometimes referred to as a spacer or photo-spacer) that helps separate the light-emitting zone of one pixel 22 from the light-emitting zone of an adjacent pixel 22.

Organic layer 90 may be formed from a photoimageable polymer such as polyimide. In the example of FIG. 9, organic layer 90 is formed over barrier layer 84 between light-emitting zones 40 such that barrier layer 84 is interposed between organic layer 90 and planarization layer 50. Protrusion 90P may protrude through openings in common layer 38T and cathode 42 or common layer 38T and/or cathode 42 may cover protrusions 90P.

Figure 10:
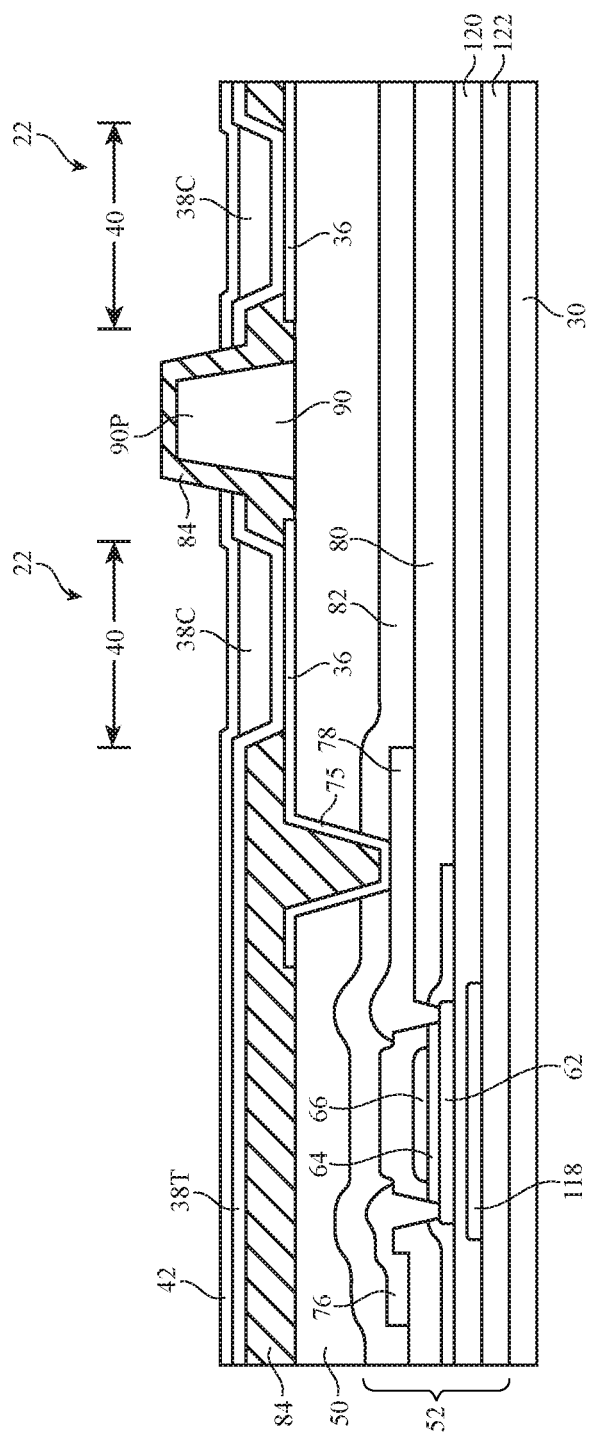
FIG. 10 is a cross-sectional side view of illustrative organic light-emitting diode display structures having a barrier layer that forms a pixel definition layer and an organic layer that forms a spacer between adjacent light-emitting zones in accordance with an embodiment.

FIG. 10 illustrates another suitable arrangement in which barrier layer 84 and organic layer 90 form a pixel definition layer for pixels 22. In the example of FIG. 10, organic layer 90 is formed under barrier layer 84 in between light-emitting zones 40 such that organic layer 90 is interposed between barrier layer 84 and planarization layer 50.

Figure 11:
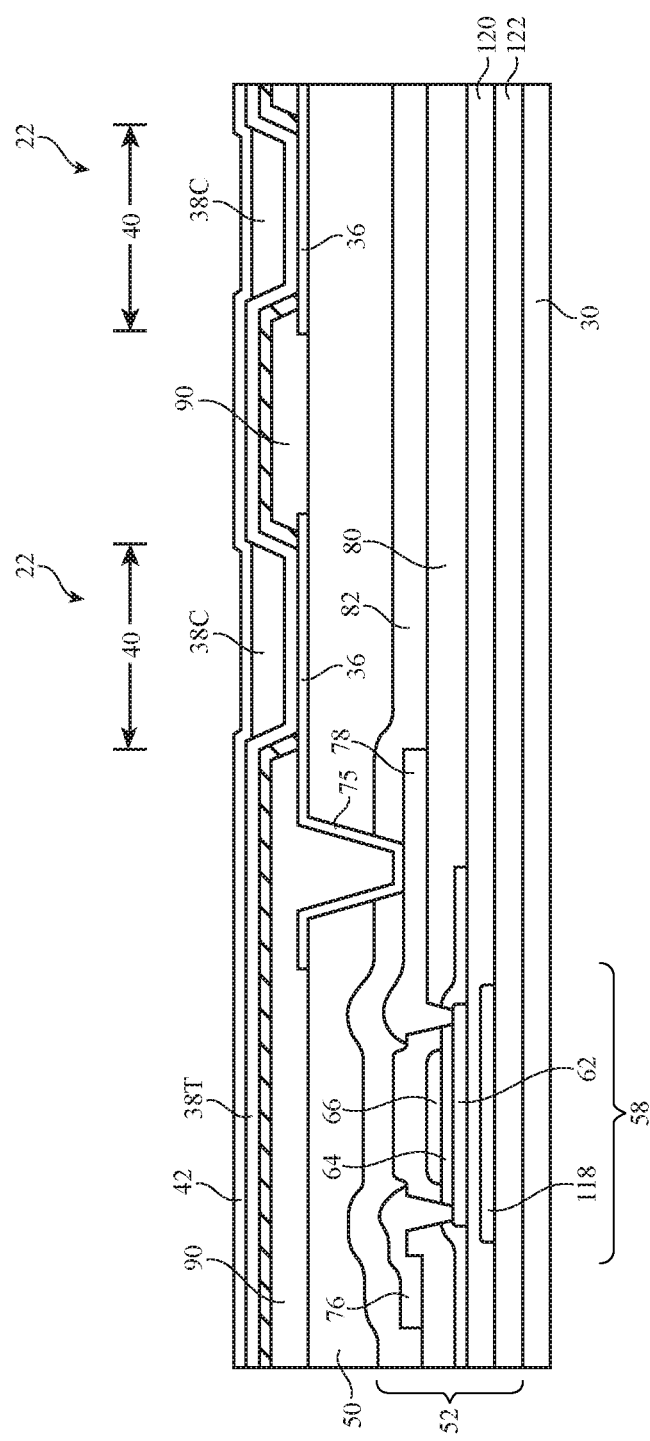
FIG. 11 is a cross-sectional side view of organic light-emitting diode display structures having a pixel definition layer formed from a barrier layer formed over an organic layer in accordance with an embodiment.

In the example of FIG. 11, organic layer 90 extends under all of barrier layer 84 such that organic layer 90 separates barrier layer 84 from planarization layer 50.

Figure 12:
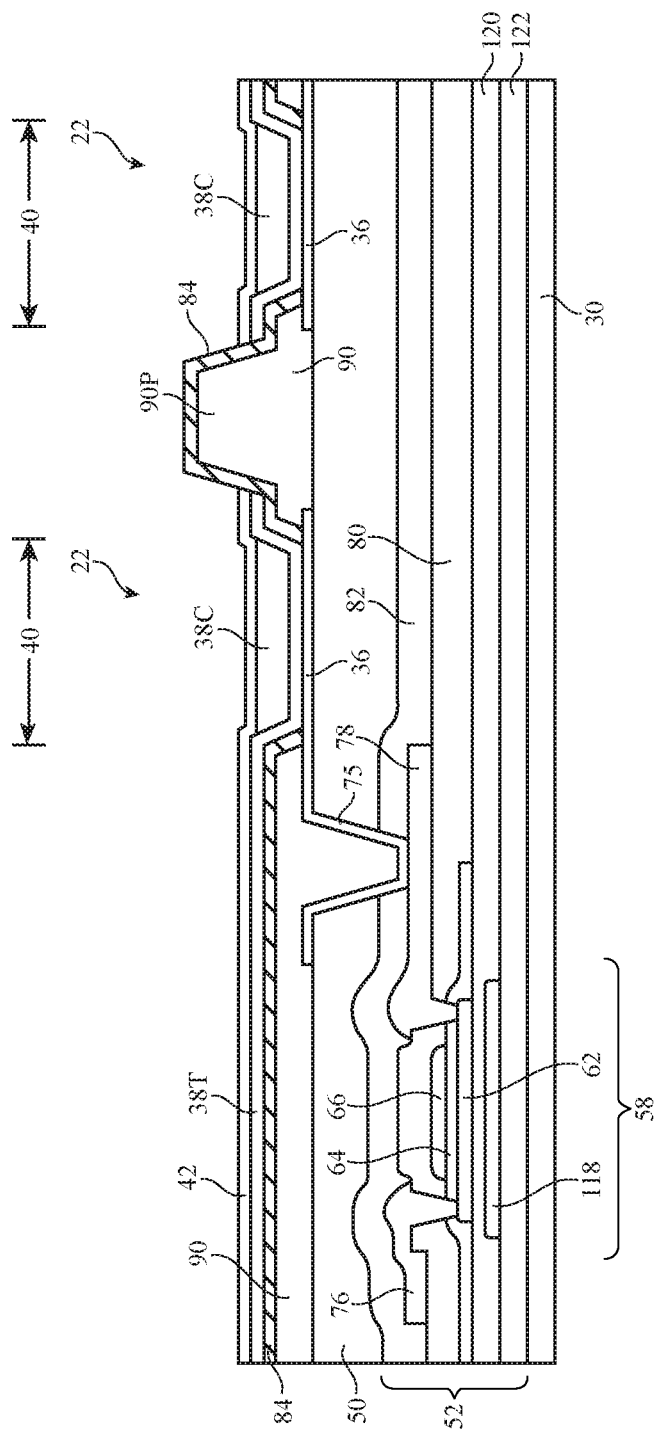
FIG. 12 is a cross-sectional side view of illustrative organic light-emitting diode display structures having a pixel definition layer formed from a barrier layer formed over an organic layer having a spacer in accordance with an embodiment.

FIG. 12 illustrates another suitable arrangement in which organic layer 90 extends under barrier layer 84. In the example of FIG. 12, organic layer 90 includes protruding portion 90P between light-emitting zones 40 to help separate adjacent pixels 22. If desired, barrier layer 84 may cover protruding portion 90P of layer 90.

Figure 13:
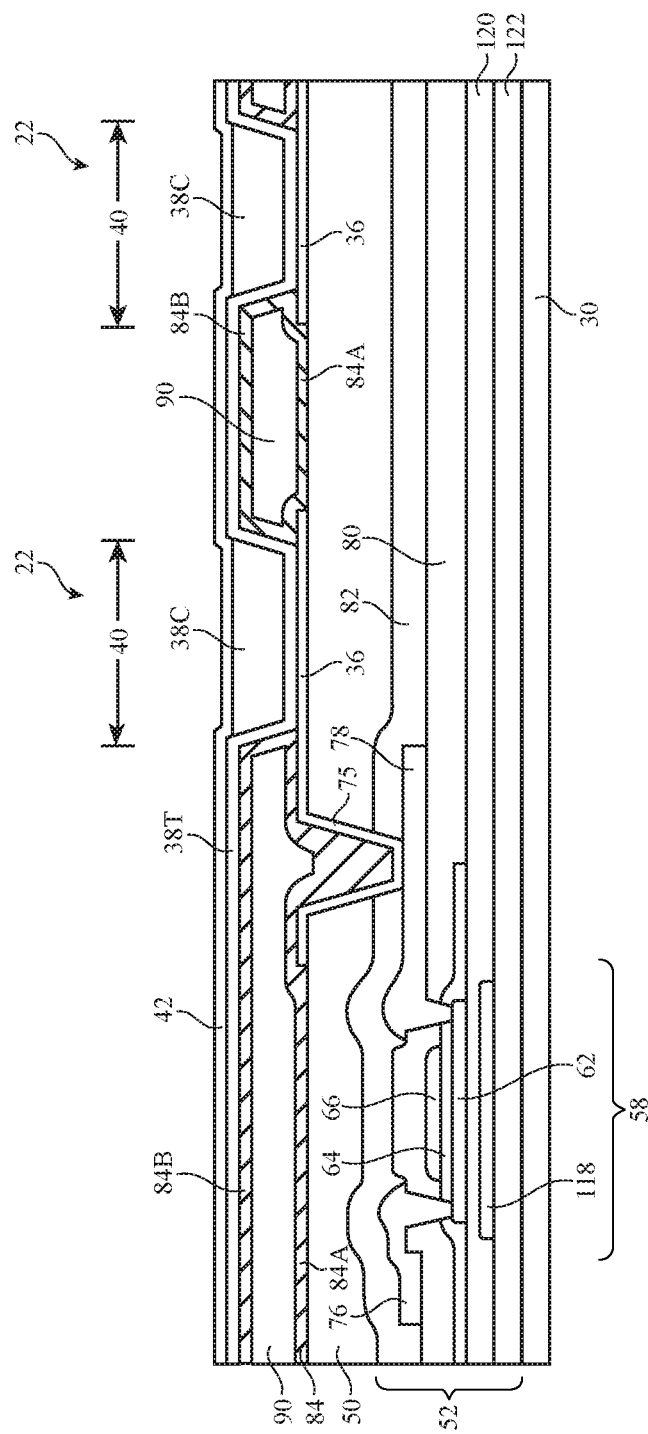
FIG. 13 is a cross-sectional side view of illustrative organic light-emitting diode display structures having a pixel definition layer formed from an organic layer interposed between first and second barrier layers in accordance with an embodiment.

FIG. 13 illustrates another suitable arrangement in which barrier layer 84 and organic layer 90 form a pixel definition layer for pixels 22. In the example of FIG. 13, organic layer 90 is interposed between first and second barrier layers 84A and 84B. If desired, organic layer 90 may be completely or partially surrounded by barrier layer 84. In this way, barrier layer 84 may protect organic layers 38 from photoactive compounds that may be outgassed from organic layer 90 and planarization layer 50.

Figure 14:
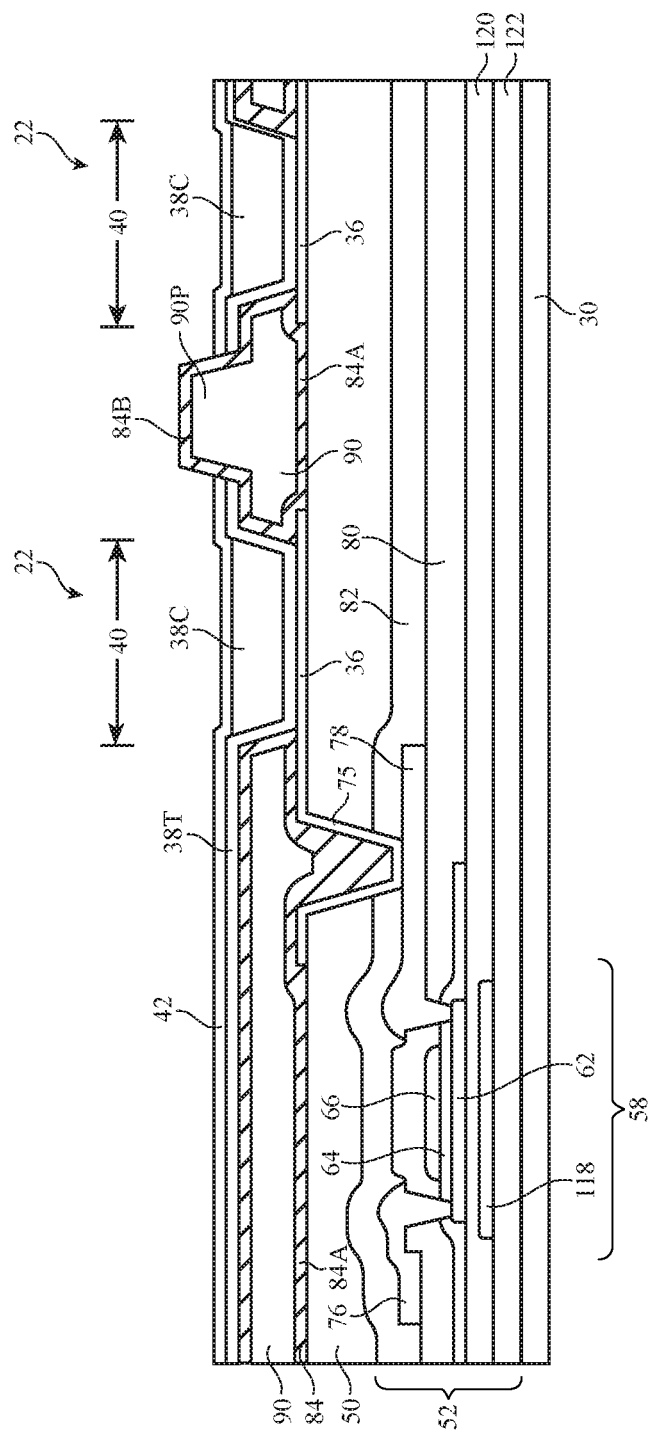
FIG. 14 is a cross-sectional side view of illustrative organic light-emitting diode display structures having a pixel definition layer formed from an organic layer that forms a spacer and that is interposed between first and second barrier layers in accordance with an embodiment.

FIG. 14 illustrates another suitable arrangement in which organic layer 90 is interposed between lower and upper barrier layers 84A and 84B. In the example of FIG. 14, organic layer 90 forms protrusions 90P between light-emitting zones 40 to help separate adjacent pixels 22. If desired, protrusion 90P may be covered by upper barrier layer 84B.

Figure 15:
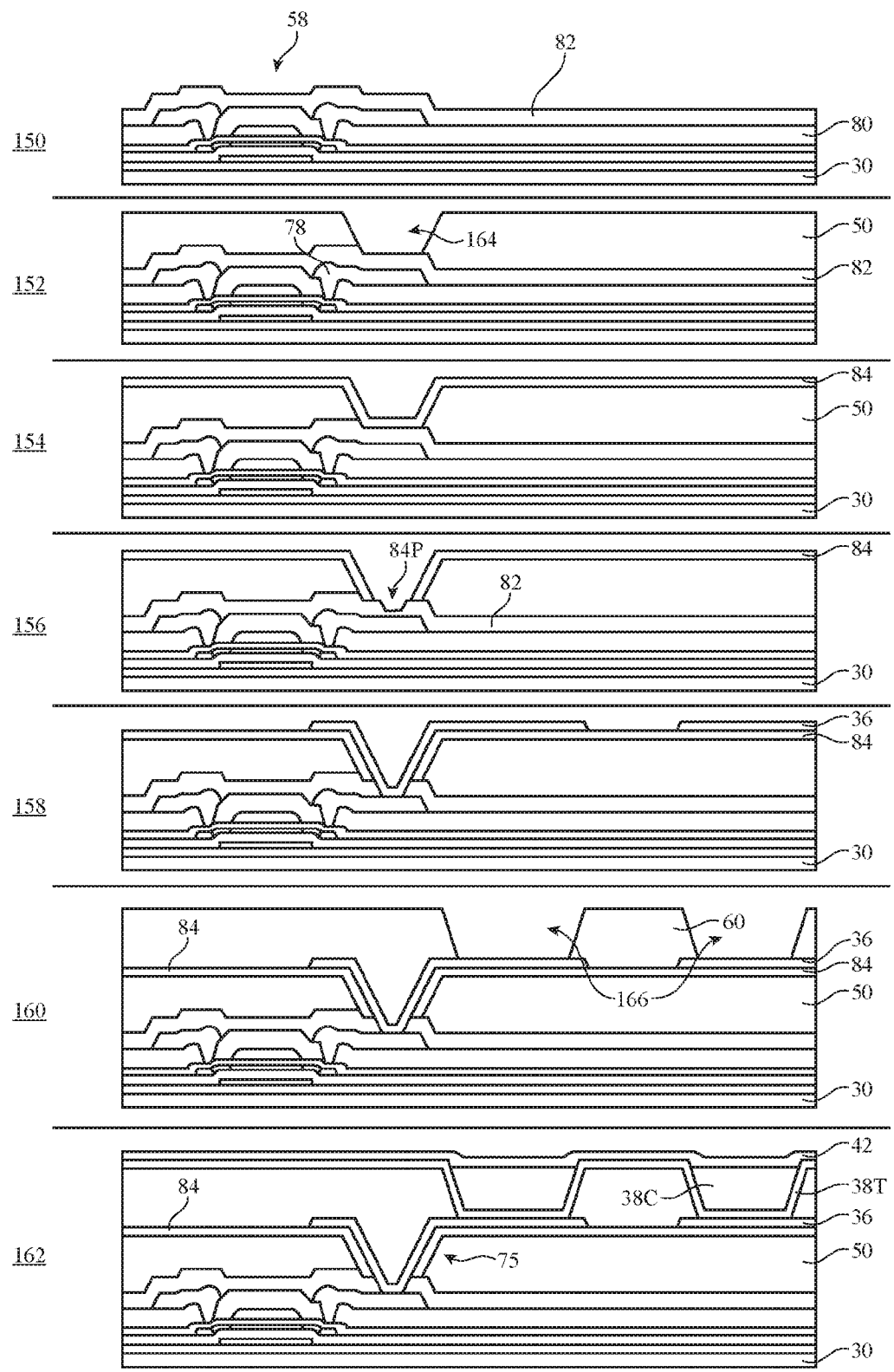
FIG. 15 is a flow chart of illustrative steps involved in fabricating display structures of the type shown in FIG. 5 in accordance with an embodiment.

FIG. 15 is a flow chart of illustrative steps for fabricating display structures of the type shown in FIG. 5.

At step 150, passivation layer 82 may be formed over thin-film transistors 58 and interlayer dielectric layer 80 on substrate 30.

At step 152, planarization layer 50 may be formed over passivation layer 82. A photolithographic mask may be used to remove portions of planarization layer 50 to form trench region 164 over source-drain terminal 78 of transistor 58.

At step 154, barrier layer 84 may be formed over planarization layer 50. As shown in FIG. 15, barrier layer 84 may line the walls of trench 164.

At step 156, a photolithographic mask may be used to remove portions of barrier layer 84 and passivation layer 82 to form openings 84P in trench region 164.

At step 158, a metal layer may be deposited over barrier layer 84 to form anodes 36.

At step 160, an organic material may be formed over barrier layer 84 and anodes 36. A photolithographic mask may be used to remove portions of the organic layer to form pixel definition layer 60 having trenches 166 in light-emitting zones 40 (see, e.g., FIG. 5).

At step 162, organic light-emitting diode layers 38 may be deposited over pixel definition layer 60 and in trenches 166. A metal layer may be deposited over organic layers 38 to form cathode 42.

Figure 16:
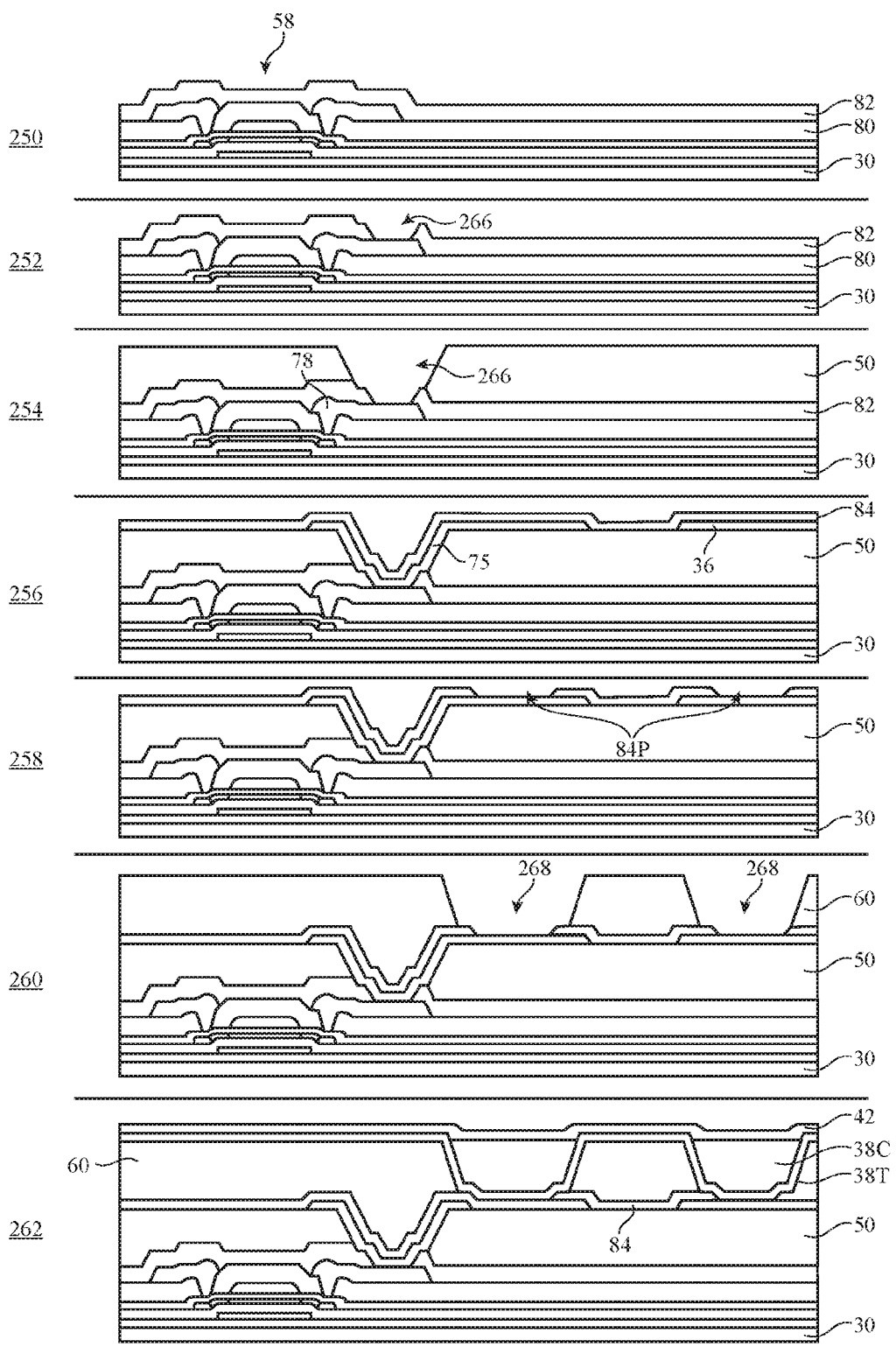
FIG. 16 is a flow chart of illustrative steps involved in fabricating display structures of the type shown in FIG. 6 in accordance with an embodiment.

FIG. 16 is a flow chart of illustrative steps for fabricating display structures of the type shown in FIG. 6.

At step 250, passivation layer 82 may be formed over thin-film transistors 58 and interlayer dielectric layer 80 on substrate 30.

At step 252, a photolithographic mask may be used to remove portions of passivation layer 82 to form trench 266 over source-drain terminal 78.

At step 254, planarization layer 50 may be formed over the passivation layer 82. A photolithographic mask may be used to remove portions of planarization layer 50 in trench region 266 over source-drain terminal 78 of transistor 58.

At step 256, a metal layer may be deposited over barrier layer 84 to form anodes 36. Barrier layer 84 may be formed over anodes 36.

At step 258, a photolithographic mask may be used to remove portions of barrier layer 84 to form openings 84P over anodes 36 in light-emitting zones.

At step 260, an organic material may be formed over barrier layer 84 and anodes 36. A photolithographic mask may be used to remove portions of the organic layer to form pixel definition layer 60 having trenches 268 in light-emitting zones 40 (see, e.g., FIG. 6).

At step 262, organic light-emitting diode layers 38 may be deposited over pixel definition layer and in trenches 268. A metal layer may be deposited over organic layers 38 to form cathode 42.

Figure 17:
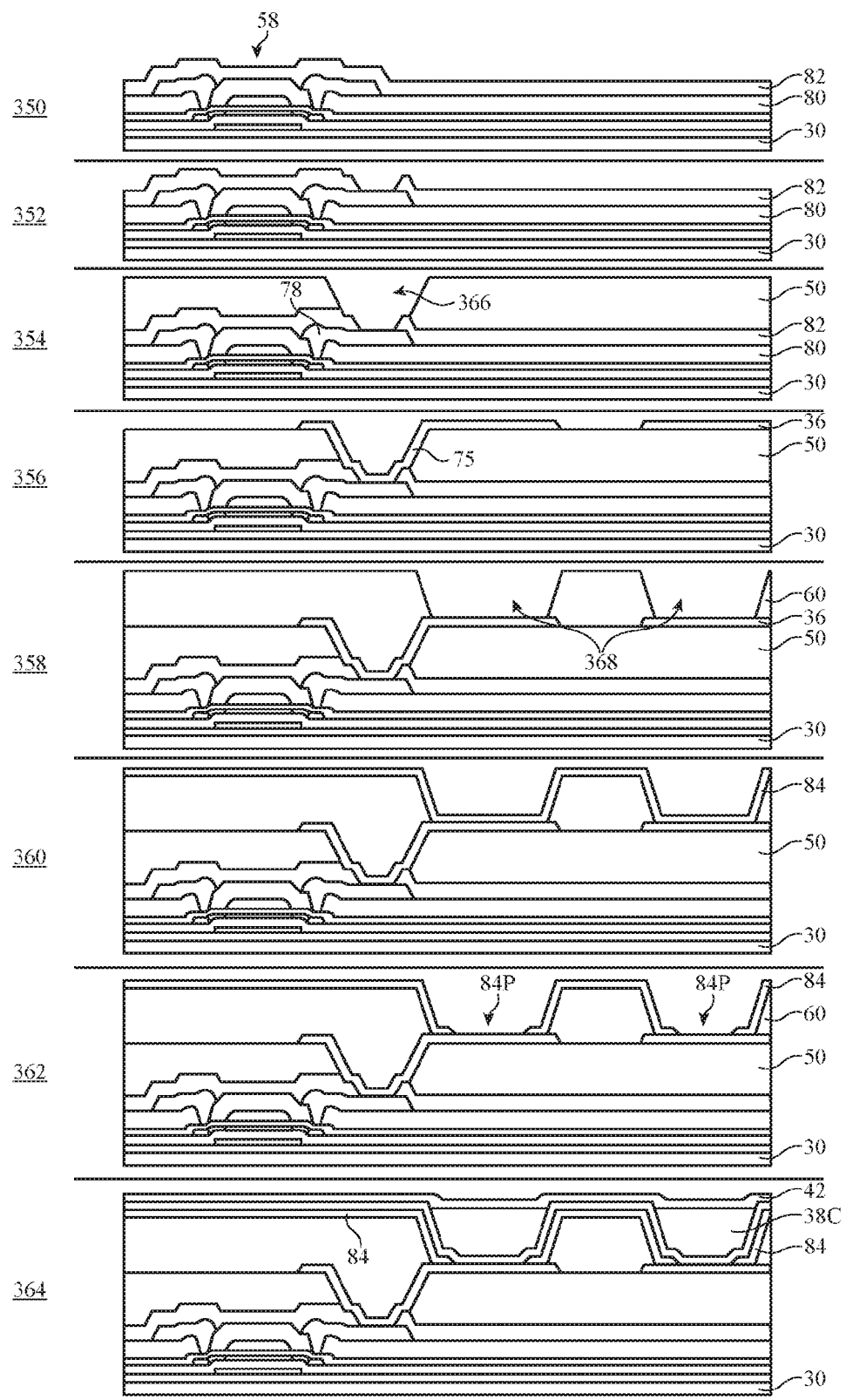
FIG. 17 is a flow chart of illustrative steps involved in fabricating display structures of the type shown in FIG. 7 in accordance with an embodiment.

FIG. 17 is a flow chart of illustrative steps for fabricating display structures of the type shown in FIG. 7.

At step 350, passivation layer 82 may be formed over thin-film transistors 58 and interlayer dielectric layer 80 on substrate 30.

At step 352, a photolithographic mask may be used to remove portions of passivation layer 82 over source-drain terminal 78.

At step 354, planarization layer 50 may be formed over the passivation layer 82. A photolithographic mask may be used to remove portions of planarization layer 50 to form trench region 366 over source-drain terminal 78 of transistor 58.

At step 356, a metal layer may be deposited over barrier layer 84 to form anodes 36.

At step 358, an organic material may be formed over anodes 36. A photolithographic mask may be used to remove portions of the organic layer to form pixel definition layer 60 having trenches 368 in light-emitting zones.

At step 360, barrier layer 84 may be formed over pixel definition layer 60. A photolithographic mask may be used to remove portions of barrier layer 84 to form openings 84P over anodes 36 in light-emitting zones 40 (see, e.g., FIG. 7).

At step 362, organic light-emitting diode layers 38 may be deposited over pixel definition layer and in trenches 368. A metal layer may be deposited over organic layers 38 to form cathode 42.

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
  an array of thin-film transistors on a substrate;
  a planarization layer over the thin-film transistors;
  an array of light-emitting diodes on the substrate including an anode and a cathode; and
  an inorganic barrier layer interposed between the planarization layer and the cathode, wherein the inorganic barrier layer has trenches that form light-emitting zones and wherein the light-emitting diodes include emissive material in the trenches.

2. The organic light-emitting diode display defined in claim 1 further comprising a pixel definition layer.

3. The organic light-emitting diode display defined in claim 2 wherein the inorganic barrier layer is interposed between the pixel definition layer and the planarization layer.

4. The organic light-emitting diode display defined in claim 3 wherein the inorganic barrier layer is interposed between the anode and the planarization layer.

5. The organic light-emitting diode display defined in claim 4 wherein the inorganic barrier layer comprises an opening through which the anode is coupled to one of the thin-film transistors.

6. The organic light-emitting diode display defined in claim 3 wherein the anode is interposed between the inorganic barrier layer and the planarization layer.

7. The organic light-emitting diode display defined in claim 6 wherein the light-emitting diodes include emissive material in a light-emitting zone and wherein the inorganic barrier layer comprises an opening that overlaps a portion of the anode in the light-emitting zone.

8. The organic light-emitting diode display defined in claim 2 wherein the pixel definition layer is interposed between the inorganic barrier layer and the planarization layer.

9. The organic light-emitting diode display defined in claim 8 wherein the light-emitting diodes include emissive material in a light-emitting zone and wherein the inorganic barrier layer comprises an opening that overlaps a portion of the anode in the light-emitting zone.

10. The organic light-emitting diode display defined in claim 1 wherein the inorganic barrier layer comprises a material selected from the group consisting of: silicon nitride and silicon dioxide.

11. A display, comprising:
an array of thin-film transistors on a substrate;
a pixel definition layer formed over the thin-film transistors, wherein the pixel definition layer comprises an inorganic layer having trenches that define light-emitting zones; and
an array of light-emitting diodes on the substrate including an anode, a cathode, and emissive material, wherein the emissive material is disposed in the trenches of the pixel definition layer.

12. The display defined in claim 11 wherein the pixel definition layer comprises an organic layer formed over the inorganic layer.

13. The display defined in claim 12 wherein the organic layer comprises a protruding portion between an adjacent pair of the light-emitting zones.

14. The display defined in claim 11 wherein the inorganic layer comprises a material selected from the group consisting of: silicon nitride and silicon dioxide.

15. The display defined in claim 11 wherein the pixel definition layer comprises an organic layer and an additional inorganic layer, wherein the organic layer is interposed between the inorganic layer and the additional inorganic layer.

16. An organic light-emitting diode display, comprising:
a substrate;
thin-film transistor circuitry on the substrate;
an organic dielectric layer on the thin-film transistor circuitry;
organic light-emitting diodes including emissive material and at least one additional layer over the organic dielectric layer; and
an inorganic layer interposed between the organic dielectric layer and the at least one additional layer.

17. The organic light-emitting diode display defined in claim 16 wherein the organic dielectric layer comprises a polymer layer.

18. The organic light-emitting diode display defined in claim 17 wherein the inorganic layer comprises a material selected from the group consisting of: silicon nitride and silicon dioxide.

19. The organic light-emitting diode display defined in claim 18 wherein the inorganic layer comprises openings that align with the emissive material.

* * * * *